United States Patent
Jung

(10) Patent No.: US 7,981,806 B2
(45) Date of Patent: Jul. 19, 2011

(54) METHOD FOR FORMING TRENCH AND METHOD FOR FABRICATING SEMICONDUCTOR DEVICE USING THE SAME

(75) Inventor: Tae-Woo Jung, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 851 days.

(21) Appl. No.: 11/948,676

(22) Filed: Nov. 30, 2007

(65) Prior Publication Data

US 2008/0233758 A1    Sep. 25, 2008

(30) Foreign Application Priority Data

Mar. 19, 2007   (KR) ................. 10-2007-0026542

(51) Int. Cl.
*H01L 21/302* (2006.01)
(52) U.S. Cl. ........ 438/735; 438/706; 438/710; 438/711; 438/712; 438/724; 257/369; 257/E21.549
(58) Field of Classification Search .................. 438/706, 438/710, 711, 712, 724, 735; 257/369, E21.549
See application file for complete search history.

(56) References Cited

U.S. PATENT DOCUMENTS

| | | | |
|---|---|---|---|
| 6,080,677 A * | 6/2000 | Gabriel et al. | 438/710 |
| 6,225,187 B1 | 5/2001 | Huang et al. | |
| 7,449,392 B2 * | 11/2008 | Kim et al. | 438/426 |
| 2004/0110358 A1 * | 6/2004 | Lee | 438/437 |
| 2006/0131658 A1 * | 6/2006 | Jong | 257/369 |
| 2006/0172546 A1 * | 8/2006 | Iijima et al. | 438/710 |

FOREIGN PATENT DOCUMENTS

| | | |
|---|---|---|
| JP | 2000-156404 | 6/2000 |
| KR | 1995-027976 | 10/1997 |
| KR | 1020040000509 | 1/2004 |
| KR | 1020050032433 | 4/2005 |
| KR | 1020050106481 | 11/2005 |
| KR | 1020070014341 | 2/2007 |

OTHER PUBLICATIONS

Jansen et al. J. Micromech. Microeng. vol. 6, (1996), pp. 14-28.*
Lee et al, Thin Solid Films, vol. 341, (1999), pp. 168-171.*
Office Action for Korean app. 10-2007-0026542.
Korean Notice of Allowance for Korean application No. 10-2007-0026542.

* cited by examiner

*Primary Examiner* — Nadine G Norton
*Assistant Examiner* — Maki A Angadi
(74) *Attorney, Agent, or Firm* — Lowe Hauptman Ham & Berner LLP

(57) ABSTRACT

A method for forming a trench includes providing a substrate, and forming the trench in the substrate using a gas containing chlorine ($Cl_2$) gas as a main etch gas and $SiF_X$ gas as an additive gas, wherein a sidewall of the trench has a substantially vertical profile by virtue of reaction of the $Cl_2$ gas and the $SiF_X$ gas.

22 Claims, 5 Drawing Sheets

METHOD FOR FORMING TRENCH AND METHOD FOR FABRICATING SEMICONDUCTOR DEVICE USING THE SAME

CROSS-REFERENCE TO RELATED APPLICATIONS

The present invention claims priority of Korean patent application number 2007-0026542, filed on Mar. 19, 2007, which is incorporated by reference in its entirety.

BACKGROUND OF THE INVENTION

The present invention relates to a method for fabricating a semiconductor device, and more particularly, to a method for forming a trench and a method for fabricating a semiconductor device using the same.

Generally, a recess gate process, a shallow trench isolation (STI) process of a flash memory device, or the like, essentially employs a process of forming a trench in a substrate by partially etching the substrate to a predetermined depth. In the forming process of a trench, it is desirable to form the trench such that its sidewalls have a vertical profile for various reasons. For instance, a process of forming a trench for a recess gate will be described hereinafter.

A recess gate process can increase a channel length of a cell transistor to thereby improve refresh characteristics of a device by forming a gate pattern of which an upper portion protrudes from the surface of the substrate while filling a trench formed by etching a predetermined portion of an active region of the substrate. To improve properties of semiconductor devices, more advanced technology has recently been announced in which an upper portion of a gate has a vertical profile and a lower portion has a spherical profile, which is called a bulb type recess gate process. In the bulb type recess gate, the upper portion of the gate having the vertical profile is referred to as a neck pattern and the lower portion of the gate having the spherical profile connected to the neck pattern is referred to as a bulb pattern.

It is required that the sidewall of the trench in the recess gate process, or the sidewall of the neck pattern in the bulb recess gate process, should have a vertical profile so as to prevent a seam in a conductive layer, e.g., a polysilicon layer, for a gate filled into the trench.

In a recess gate process currently used, however, an etch barrier layer used in etching the substrate to form a trench is an oxide layer, and thus a bowing phenomenon takes place at a sidewall profile of the trench because small amount of byproduct results in the decrease in passivation effect of the trench sidewall (see A of FIG. 1). To improve the bowing phenomenon, the etch process may be performed using an etch gas obtained by adding hydrogen ($H_2$) gas into nitrogen ($N_2$)/chlorine ($Cl_2$) gas. However, it is not preferable to use the $H_2$ gas because it is too dangerous. Further, a field oxide layer may be lost during the etch process of forming the trench for a recess gate (see B of FIG. 1).

In addition to the aforementioned recess gate process, the trench forming process for a semiconductor memory device encounters a great challenge to achieve the effective passivation of the trench sidewall and thus to prevent the bowing phenomenon of the trench sidewall profile during all the processes of forming a trench by selectively etching a substrate, for example, in the case where the trench sidewall for device isolation must be formed vertically in an STI process of a flash memory device.

SUMMARY OF THE INVENTION

Embodiments of the present invention are directed to provide a method for forming a trench and a method for fabricating a semiconductor device using the same, which can form a trench having a sidewall with a vertical profile by performing an etch process for forming a trench by adding $SiF_X$ gas instead of $H_2$ gas into a main etch gas of $Cl_2$ gas.

In accordance with an aspect of the present invention, there is provided a method for forming a trench. The method includes providing a substrate, and forming the trench in the substrate using a gas containing chlorine ($Cl_2$) gas as a main etch gas and $SiF_X$ gas as an additive gas, wherein a sidewall of the trench has a substantially vertical profile formed by reaction of the $Cl_2$ gas and the $SiF_X$ gas.

In accordance with another aspect of the present invention, there is provided a method for fabricating a semiconductor device having a recess gate. The method includes providing a substrate, forming a hard mask pattern over the substrate, and forming a trench for the recess gate having a substantially vertical profile by etching the substrate using the hard mask pattern as an etch barrier and using a gas containing $Cl_2$ gas as a main gas and $SiF_X$ gas as an additive gas.

DESCRIPTION OF SPECIFIC EMBODIMENTS

Embodiments of the present invention relate to a method for forming a trench and a method for fabricating a semiconductor device using the same.

Figure 1:
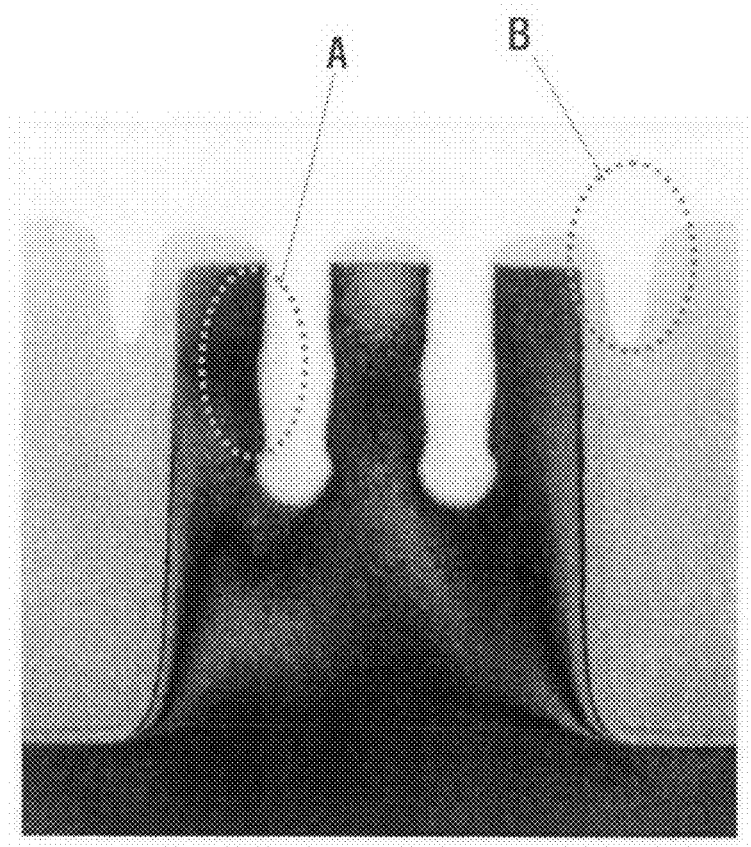
FIG. 1 illustrates limitations in a typical method for forming a trench for a recess gate.
Figure 2:
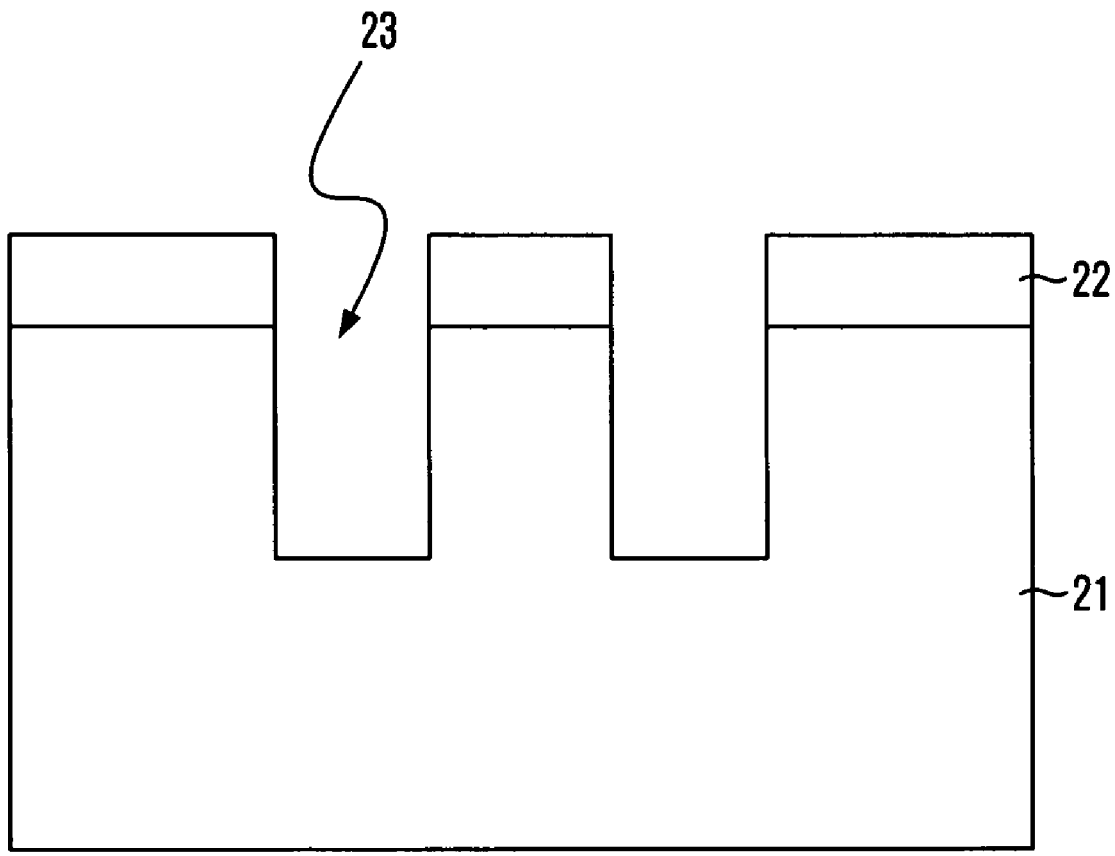
FIG. 2 is a cross-sectional view of a method for forming a trench in accordance with an embodiment of the present invention.

FIG. 2 is a cross-sectional view of a method for forming a trench in accordance with an embodiment of the present invention. Referring to FIG. 2, a mask pattern 22 is formed over a substrate 21 to expose a region that will be etched. The substrate 21 is etched using the mask pattern 22 as an etch barrier to form a trench 23. The etch process is performed using $Cl_2$ gas as a main etch gas and $SiF_X$ as an additive gas, where x is a positive integer. In the case where the etch process is performed using $Cl_2$ gas and $SiF_X$ gas to form the trench 23, the trench 23 has a sidewall with a vertical profile by virtue of reaction of the $Cl_2$ gas and the $SiF_X$ gas. The reason is that the sidewall of the trench 23 is passivated by a polymer generated from the reaction of the $Cl_2$ gas and the $SiF_X$ gas.

For example, if the $SiF_X$ gas is tetrafluorosilane ($SiF_4$), the reaction of the $Cl_2$ gas and the $SiF_4$ gas will be expressed as a following reaction formula.

$$2SiF_4 + Cl_2 \rightarrow 2SiF_3Cl + 2F \qquad \text{(reaction formula)}$$

Herein, the chlorotrifluorosilane ($SiF_3Cl$) polymer produced from the reaction expressed as above Reaction formula is deposited on an exposed portion of the substrate 21, i.e., the sidewall of the trench 23, thereby passivating the sidewall of the trench 23. Therefore, it is possible to prevent the bowing phenomenon of the sidewall of the trench 23 and thus to obtain a vertical profile even though the substrate 21 is etched by the main etch gas of the $Cl_2$ gas and F radical produced from the reaction.

It is preferable that the etch of the substrate 21 for forming the trench 23 is performed in a chamber under the conditions that a chamber temperature is in the range of approximately 0° C. to approximately 50° C. and/or a chamber pressure is in the range of approximately 4 mTorr to approximately 50 mTorr. The etch may be performed by further adding $N_2$ gas and/or hydrogen bromide (HBr) gas into the main gas. In addition, it is preferable that the depth of the trench 23 is in the range of approximately 500 Å to approximately 2,000 Å. Preferably, the sidewall of the trench 23 has a substantially vertical profile, that is, an angle in the range of approximately 88° to approximately 90° with respect to a top surface of the substrate 21.

The aforementioned method for forming the trench having a vertical profile may be applied to various processes of fabricating semiconductor devices. In the present disclosure, for instance, the inventive method for forming the trench will be exemplarily applied to a recess gate process, which will be more fully described with reference to FIGS. 3A to 3D.

Figure 3A:
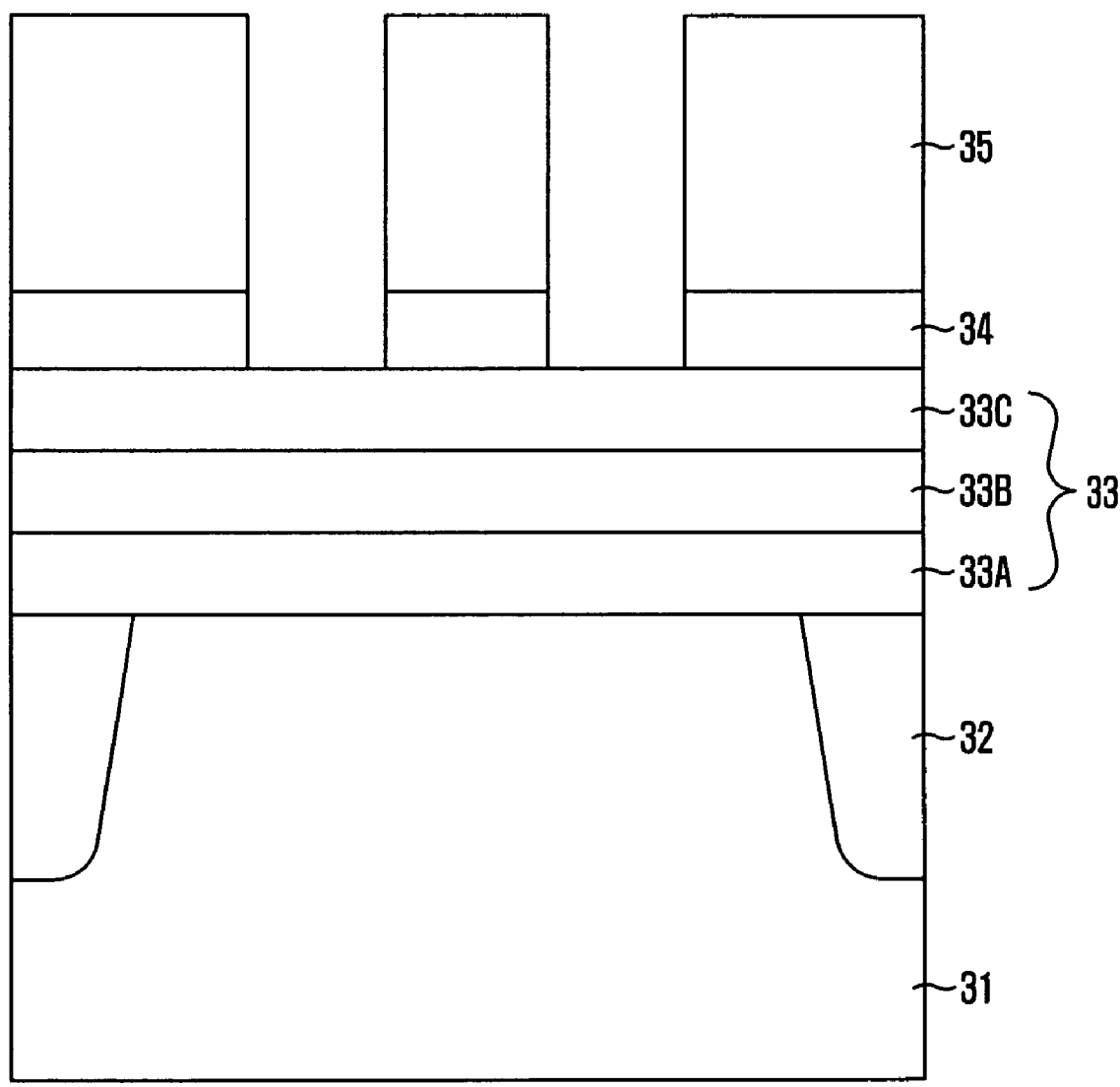
FIGS. 3A to 3D are cross-sectional views of a method for forming a recess gate using the method of FIG. 2.

FIGS. 3A to 3D are cross-sectional views of a method for forming a recess gate using the method of FIG. 2. Referring to FIG. 3A, a field oxide structure 32 is formed in a substrate 31. A hard mask layer 33, which will serve as an etch barrier in an etch process for forming a trench, is formed over the substrate 31 where the field oxide structure 32 is formed. The hard mask layer 33 has a multi-layered structure where an oxide layer 33A, an amorphous carbon layer 33B and a silicon oxynitride (SiON) layer 33C are stacked in sequence. The oxide layer 33A may include, for example, a low-pressure tetraethyl orthosilicate (LPTEOS) layer.

A photoresist pattern 35 is formed over the hard mask layer 33 so as to expose a region where a trench will be formed. An anti-reflection layer 34 may be disposed under the photoresist pattern for preventing reflection during an exposure process.

Figure 3B:
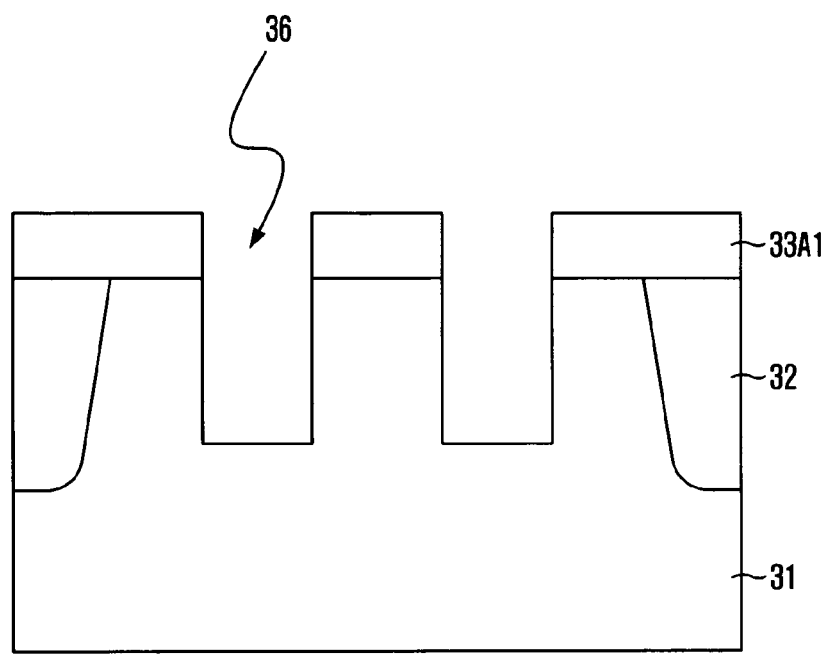

Referring to FIG. 3B, the SiON layer 33C, the amorphous carbon layer 33B and the oxide layer 33A are sequentially etched using the photoresist pattern 35 as an etch mask. The photoresist pattern 35, the etched SiON layer 33C and the etched carbon layer 33B are then removed to form an oxide pattern 33A1 over the substrate 31, thus exposing the region where the trench will be formed.

The exposed substrate 31 is etched using the oxide pattern 33A1 as an etch barrier to form a trench 36 for a recess gate. Since the trench 36 for the recess gate is formed through the same process as illustrated in FIG. 2, the trench 36 has a substantially vertical sidewall so that there is no seam phenomenon during a subsequent process of depositing a polysilicon layer for a gate electrode filling the trench 36 for recess gate. In particular, because a polymer, e.g., $SiF_3Cl$ polymer, produced by the reaction of the $Cl_2$ gas and the $SiF_X$ gas is deposited on the field oxide structure 32 which may be damaged during the etch of the oxide pattern 33A1, as well as on the sidewall of the trench 36, it is possible to compensate for a damage of the field oxide structure 32. The process of forming the trench 36 for the recess gate is identical to the process of FIG. 2, and hence description for it will be omitted herein.

In the case of forming a recess gate, the oxide pattern 33A1 is removed and a polysilicon layer for a gate electrode is then deposited on a resultant structure after performing the processes of FIGS. 3A and 3B.

Figure 3C:
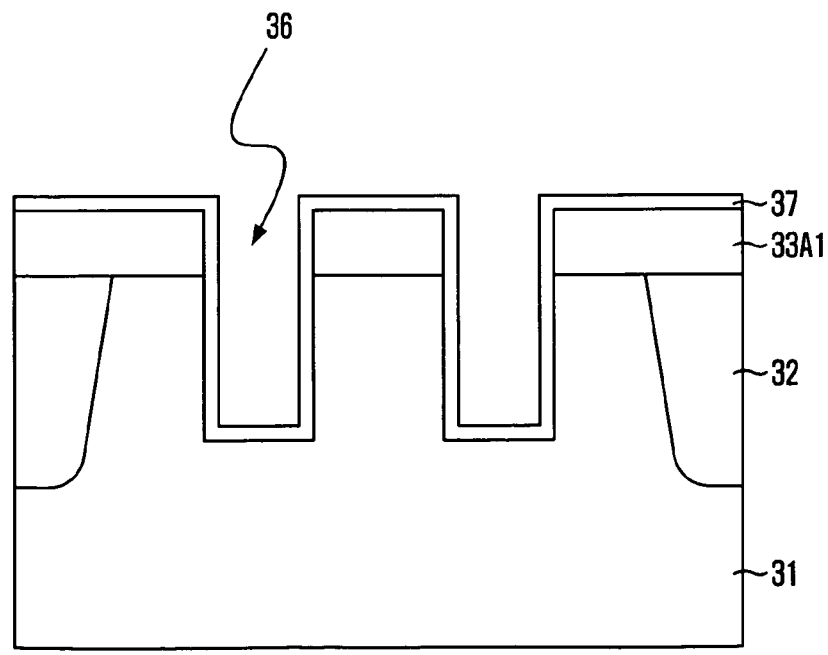
Figure 3D:
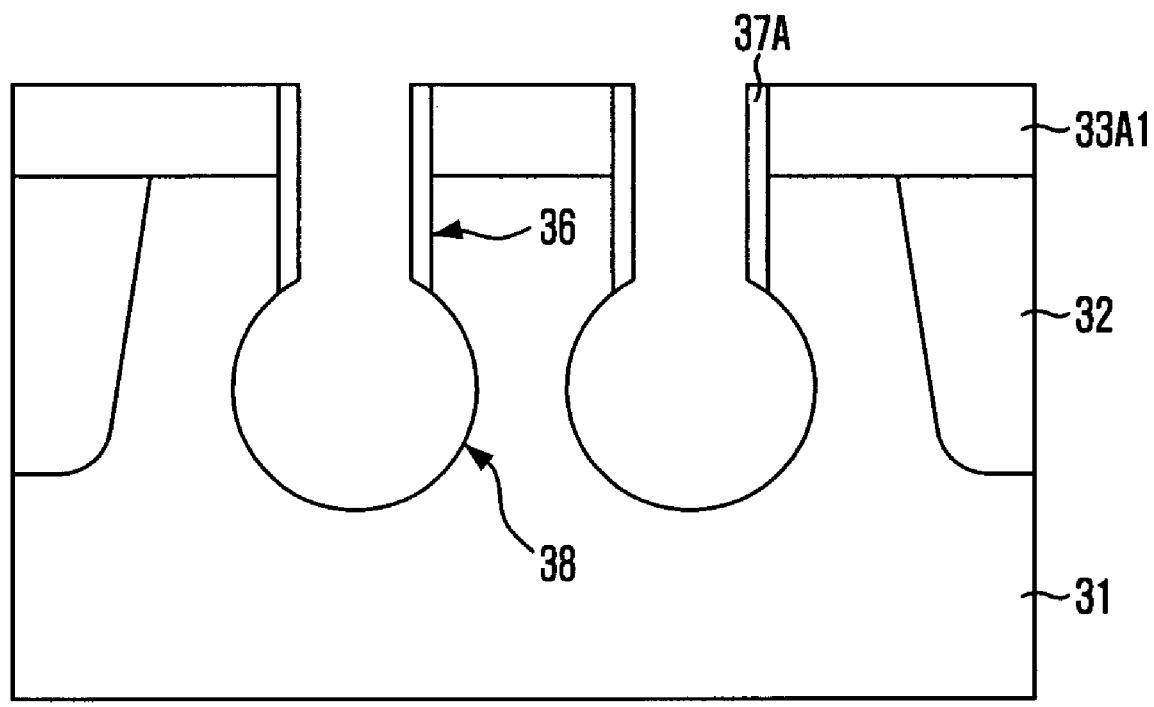

On the other hand, in the case of forming a bulb type recess gate, processes of FIGS. 3C and 3D should be performed subsequent to the processes of FIGS. 3A and 3B. In this case, the trench 36 formed through the processes of FIGS. 3A and 3B corresponds to a neck pattern.

Referring to FIG. 3C, a cleaning process is performed using sulfuric acid ($H_2SO_4$)/hydrogen peroxide ($H_2O_2$) in order to remove a natural oxide layer. Thereafter, a material layer 37 for a spacer is formed over a resultant structure. Herein, the material layer 37 for the spacer will serve as an etch barrier during a subsequent etch process of the substrate 31 for forming a bulb pattern. The material layer 37 for the spacer may include an oxide-based thin film formed through plasma treatment using $O_2/N_2$ gas or $O_2/N_2$/silicon tetrachloride ($SiCl_4$) gas. Preferably, the material layer 37 is formed to a thickness ranging from approximately 10 Å to approximately 30 Å.

Referring to FIG. 3D, a blanket etch is performed on the material layer 37 for the spacer to form a spacer 37A on the sidewall of the neck pattern 36. The substrate 31 under the exposed neck pattern 36 is isotropically etched to form a bulb pattern 38 having a spherical profile. The isotropic etch is performed using one selected from the group consisting of $SiF_4$, HBr, $Cl_2$ and sulfur hexafluoride ($SF_6$) gases and a combination thereof.

The exposed substrate 31 is isotropically etched by a target thickness ranging from approximately 20 Å to approximately 40 Å so as to remove damages occurring during the etch process. At this point, the isotropic etch is performed using one of tetrafluoromethane ($CF_4$)/$O_2$ and nitrogen trifluoride ($NF_3$)/helium (He)/$O_2$.

Although not shown, the spacer 37A and the remaining oxide pattern 33A1 are removed, and a polysilicon layer for a gate electrode is then deposited over a resultant structure.

Through the recess gate process as described above, a trench having a vertical profile can be formed, thus preventing a seam when filling a conductive layer for a gate electrode into the trench. Further, it is possible to compensate for the damage of the field oxide structure which may take place during an etch process of an oxide layer used as a hard mask.

In a method for forming a trench and a method for fabricating a semiconductor device using the same in accordance with the present invention, it is possible to form a trench sidewall with a vertical profile by performing an etch process for forming a trench by adding $SiF_X$ gas instead of the $H_2$ gas into a main etch gas of the $Cl_2$ gas. In addition, the damage of a field oxide can also be prevented when such a method for forming the trench is applied to a recess gate process.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

For example, although the process of forming the trench illustrated in FIG. 2 is applied to the recess gate process of FIG. 3 in the present disclosure, the present invention is not limited to this. Therefore, the inventive method is applicable to all the processes, e.g., STI process, requiring a trench with vertical profile.

What is claimed is:

1. A method for forming a trench, the method comprising:
   providing a substrate; and
   forming the trench in the substrate using a gas containing chlorine ($Cl_2$) gas as a main etch gas and $SiF_X$ gas as an additive gas,
   wherein a sidewall of the trench has a substantially vertical profile by virtue of reaction of the $Cl_2$ and the $SiF_X$ gas,
   wherein the sidewall of the trench is passivated by a polymer produced by the reaction of the $Cl_2$ gas and the $SiF_X$ gas where x=4.

2. The method of claim 1, wherein the SiF$_X$ gas includes tetrafluorosilane (SiF$_4$) gas and the reaction of the Cl$_2$ gas and the SiF$_4$ gas is expressed as follows:

$$2SiF_4+Cl_2 \rightarrow 2SiF_3+2F.$$

3. The method of claim 1, wherein the forming of the trench is performed in a chamber at a temperature ranging from approximately 0° C. to approximately 50° C.

4. The method of claim 1, wherein the forming of the trench is performed under a pressure ranging from approximately 4 mTorr to approximately 50 mTorr.

5. The method of claim 1, wherein the trench has a depth ranging from approximately 500 Å to approximately 2,000 Å.

6. The method of claim 1, wherein the sidewall of the trench has an angle ranging from 88° to approximately 90° with respect to a top surface of the substrate.

7. The method of claim 1, wherein the main etch gas further includes one selected from a group consisting of nitrogen (N$_2$) gas, hydrogen bromide (HBr) gas and a combination thereof.

8. The method of claim 1, wherein the trench includes a trench for a recess gate or a trench for an isolation.

9. A method for fabricating a semiconductor device having a recess gate, the method comprising:
   providing a substrate;
   forming a hard mask pattern over the substrate; and
   forming a trench for the recess gate having a substantially vertical profile by etching the substrate using the hard mask pattern as an etch barrier and using a gas containing Cl$_2$ gas as a main gas and SiF$_x$ gas as an additive gas,
   wherein the forming of the trench comprises passivating a sidewall of the trench with a polymer produced by reaction of the Cl$_2$ gas and the SiF$_x$ gas where x=4.

10. The method of claim 9, further comprising, after forming the trench:
    forming a spacer on the sidewall of the trench; and
    isotropically etching the substrate under the trench using the spacer as an etch barrier.

11. The method of claim 10, wherein the forming of the spacer comprises:
    forming a material layer for the spacer over a resultant structure including the trench; and
    performing a blanket etch on the material layer for the spacer.

12. The method of claim 11, wherein the material layer for the spacer includes an oxide-based thin film and is formed through plasma treatment using oxygen (O$_2$)/nitrogen (N$_2$) gas or O$_2$/N$_2$/tetrachlorosilane (SiCl$_4$) gas.

13. The method of claim 11, wherein the material layer for the spacer is formed to a thickness ranging from approximately 10 Å to approximately 30 Å.

14. The method of claim 10, wherein the isotropically etching of the substrate is performed using one selected from a group consisting of SiF$_4$, HBr, Cl$_2$ and SF$_6$ gases and a combination thereof.

15. The method of claim 10, further comprising removing an etch damage layer over the exposed substrate after isotropically etching the substrate.

16. The method of claim 15, removing the etch damage layer is performed through an isotropic etch process using one of tetrafluoromethane (CF$_4$)/O$_2$ and nitrogen trifluoride (NF$_3$)/helium (He)/O$_2$ and has an etch target ranging from approximately 20 Å to approximately 40 Å.

17. The method of claim 9, wherein the SiF$_X$ gas includes SiF$_4$ gas and the reaction of the Cl$_2$ gas and the SiF$_4$ gas is expressed as follows:

$$2SiF_4+Cl_2 \rightarrow 2SiF_3Cl+2F.$$

18. The method of claim 9, wherein the forming of the trench is performed in a chamber at a temperature ranging from approximately 0° C. to approximately 50° C. and under a pressure ranging from approximately 4 mTorr to approximately 50 mTorr.

19. The method of claim 9, wherein the trench has a depth ranging from approximately 500 Å to approximately 2,000 Å.

20. The method of claim 9, wherein the sidewall of the trench has an angle ranging from 88° to approximately 90° with respect to a top surface of the substrate.

21. The method of claim 9, wherein the main etch gas further includes one selected from a group consisting of N$_2$ gas and HBr gas and a combination thereof.

22. The method of claim 9, after forming the trench, further comprising performing a cleaning process using sulfuric acid (H$_2$SO$_4$)/hydrogen peroxide (H$_2$O$_2$).

* * * * *